United States Patent
Bond et al.

(10) Patent No.: US 9,244,132 B2
(45) Date of Patent: Jan. 26, 2016

(54) SYSTEMS AND METHODS FOR DETERMINING BATTERY STATE-OF-HEALTH

(75) Inventors: James R. Bond, Webb City, MO (US); Jeff Dermott, Carthage, MO (US); Eivind Listerud, Osceola, MO (US)

(73) Assignee: EAGLEPICHER TECHNOLOGIES, LLC, Joplin, MO (US)

( * ) Notice: Subject to any disclaimer, the term of this patent is extended or adjusted under 35 U.S.C. 154(b) by 506 days.

(21) Appl. No.: 13/588,580

(22) Filed: Aug. 17, 2012

(65) Prior Publication Data

US 2013/0066573 A1  Mar. 14, 2013

Related U.S. Application Data

(60) Provisional application No. 61/533,519, filed on Sep. 12, 2011.

(51) Int. Cl.
*G06F 19/00* (2011.01)
*G01R 31/36* (2006.01)
*H01M 10/42* (2006.01)

(52) U.S. Cl.
CPC ........ *G01R 31/3679* (2013.01); *G01R 31/3648* (2013.01); *H01M 10/4207* (2013.01)

(58) Field of Classification Search
CPC ............. G01R 31/3651; G01R 31/362; G01R 31/3606; G01R 31/3679; G01R 31/3624; G06F 19/00; H01M 10/4207
USPC ............................. 702/63; 320/134; 324/433
See application file for complete search history.

(56) References Cited

U.S. PATENT DOCUMENTS

| | | | | |
|---|---|---|---|---|
| 6,366,054 | B1* | 4/2002 | Hoenig et al. | 320/132 |
| 8,880,253 | B2* | 11/2014 | Li et al. | 701/22 |
| 2007/0139008 | A1* | 6/2007 | Sterz et al. | 320/125 |

(Continued)

FOREIGN PATENT DOCUMENTS

| | | |
|---|---|---|
| CN | 101380950 A | 3/2009 |
| CN | 101821896 A | 9/2010 |

(Continued)

OTHER PUBLICATIONS

Mizuta, Yoshihiko, Detecting method of total capacity of secondary battery and detector of total capacity, Mar. 2003, JPO, JP2003-068369A.*

Moo et al., Parallel Operation of Battery Power Modules, Jun. 2008, IEEE, 0885-8969, p. 701-707.*

Chinese Office Action for CN Application No. 201210335843.8 dated Jul. 23, 2014 (16 pages).

(Continued)

*Primary Examiner* — John Breene
*Assistant Examiner* — Mohammad K Islam
(74) *Attorney, Agent, or Firm* — Sutherland Asbill & Brennan LLP

(57) ABSTRACT

A system and method use an open-circuit voltage (OCV) method of calculating a state-of-health (SOH) of a chemical battery. The OCV system and method includes charging the battery to a maximum charge potential, determining an open-circuit voltage (OCV) of the battery after waiting a predetermined period of time after completion of the charging, and determining the SOH of the battery based on the determined OCV of the battery. Another system and method use a time-to-charge (TTC) method of calculating a state-of-health (SOH) of a chemical battery. The TTC system and method includes monitoring and storing a charge time of the battery in a memory and scaling the stored charge time to form an SOH indication.

19 Claims, 7 Drawing Sheets

(56) References Cited

U.S. PATENT DOCUMENTS

| | | | |
|---|---|---|---|
| 2009/0070052 A1* | 3/2009 | Taniguchi | G01R 31/3651 702/63 |
| 2010/0090651 A1* | 4/2010 | Sahu et al. | 320/132 |
| 2011/0148424 A1* | 6/2011 | Chiang et al. | 324/427 |
| 2011/0172939 A1* | 7/2011 | Uprety et al. | 702/63 |

FOREIGN PATENT DOCUMENTS

| | | |
|---|---|---|
| CN | 102119338 A | 7/2011 |
| FR | 2 955 670 A1 | 7/2011 |
| JP | 2003-068369 A | 3/2003 |
| JP | 2003068369 A * | 3/2003 |
| JP | A-2003-68369 | 3/2003 |

OTHER PUBLICATIONS

Jan. 14, 2014 Office Action issued in Japanese Application No. 2012-199725.

Jan. 21, 2015 European Search Report issued in European Patent Application No. 12184016.9.

Apr. 13, 2015 Chinese Office Action issued in Chinese Patent Application No. 201210335843.8.

Goebel K et al., "Prognostics in Battery Health Management", IEEE Instrumentation & Measurement Magazine, IEEE Service Center, Piscataway, NJ, US, vol. 11, No. 4, Aug. 1, 2008, pp. 33-40.

Chin-Sien Moo et al., "Parallel Operation of Battery Power Modules", IEEE Transactions on Energy Conversion, IEEE Service Center, Piscataway, NJ, US, vol. 23, No. 2, Jun. 1, 2008, pp. 701-707.

\* cited by examiner

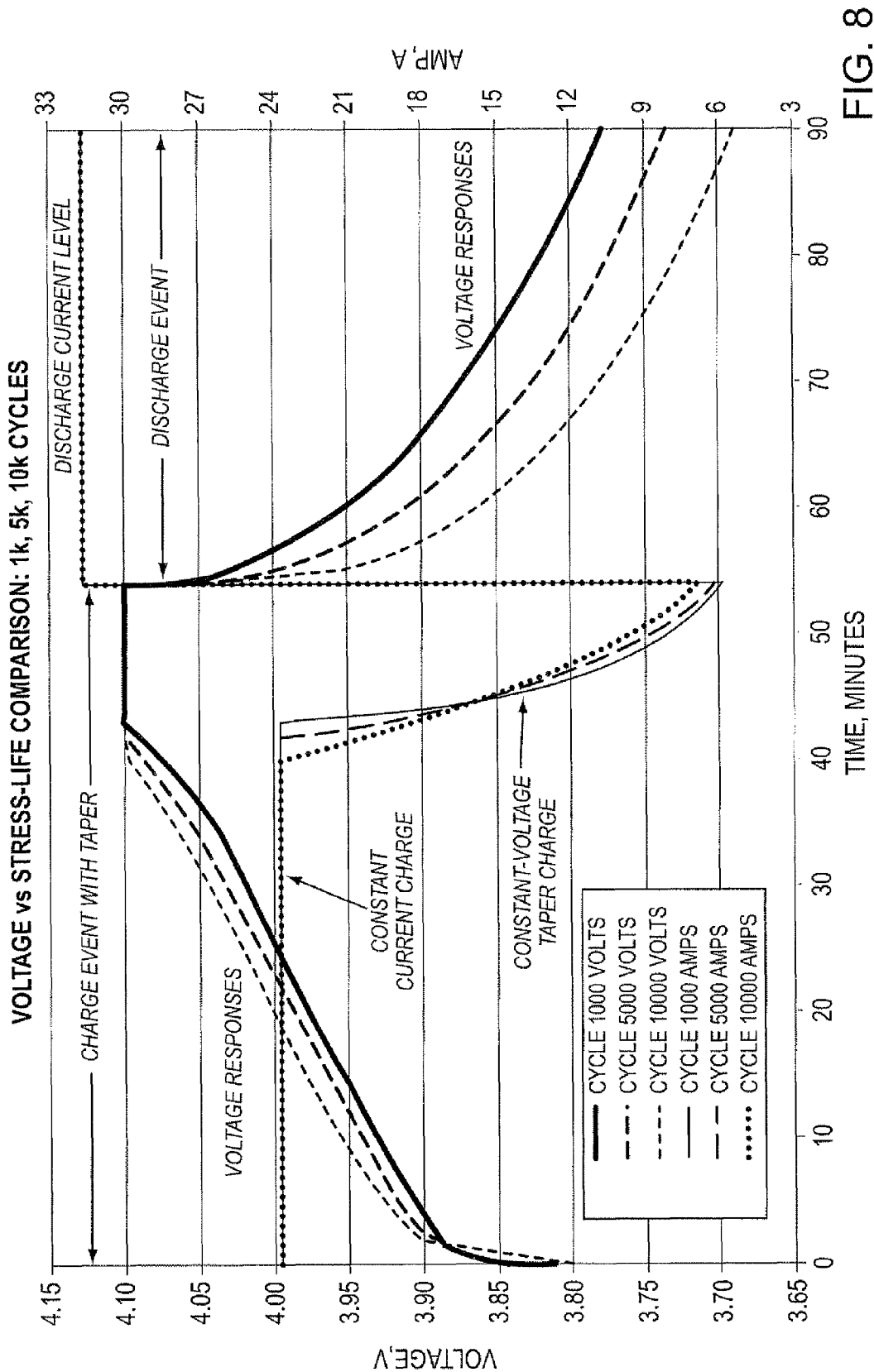

SYSTEMS AND METHODS FOR DETERMINING BATTERY STATE-OF-HEALTH

BACKGROUND

This disclosure relates to the determination of the state-of-health (SOH) of a battery. Specifically, the invention relates to systems and methods for determining the SOH of a rechargeable battery and, in particular, a lithium battery. The invention, however, is not limited to lithium batteries but is applicable to any rechargeable battery that degrades over time, thus necessitating the determination of the battery's SOH.

Over time, rechargeable batteries age and degrade causing a decrease in the batteries' ability to hold a charge and to deliver its rated current to a load. Eventually, a battery will need to be replaced after it has degraded to the point that it no longer effectively holds a charge. The SOH of a battery indicates the returnable (usable) or net capacity of a battery cell through its cumulative stress-life. The SOH of a battery is also an indication of how closely the battery meets its design specifications.

Rechargeable batteries are used in many different fields where it is critical that the battery have a minimum capacity following charge so that the battery may perform its intended function. Capacity is the maximum charge that a battery is capable of holding. The capacity of a brand new battery should be approximately that which is indicated by the manufacturer. Determining the minimum capacity of a battery is of particular importance in applications such as medical devices, military weapons, and aircraft emergency power applications where failure of the battery due to insufficient charge may result in disastrous consequences.

The monitoring of the battery's state-of-charge (SOC) is desirable in rechargeable battery cells. The SOC is the quantification (in percentage (%)) of the usability of the cell in terms of its relative charge level. A traditional SOC indication for a lithium cell is generally related to the terminal voltage of the cell during a stabilized open-circuit stand. The open-circuit voltage (OCV) functions much like a fuel gauge to convey when the cell is fully charged, fully depleted, or at some other usable state between those two end points. However, as discussed above, the cell will age and degrade over time such that the degradation mechanism causes the cell's impedance to increase. During charge, an aged cell will reach a specified end-of-charge voltage (EOCV) and correctly report 100% SOC, as the correct indication that the cell has received its maximum available charge. As the battery ages, however, even though the battery indicated 100% SOC at the completion of charging, after some settling time has elapsed, the subsequent OCV response for an aged cell will decline and indicate SOC of less than 100% due to the rise in the cell's impedance. Thus, it has been found that there is a need for a separate measure from the SOC "charge status" fuel gauge that will directly capture the returnable or net capacity of the cell through its cumulative stress-life.

There are a number of approaches that have been posited for determining the SOH of a battery. For example, a first approach calculates the SOH by measuring the internal resistance of a battery. When a battery is experiencing high internal resistance, this is an indication that the SOH of the battery is low (i.e., poor). However, this measurement alone does not provide a true estimation of the battery's SOH. Specifically, this estimation disregards various factors (i.e., the decrease in internal resistance over time as well as the effect of temperature and protective circuits) that affect the SOH of the battery. While this estimation is good for laboratory uses or infrequent stationary uses, it is generally unable to be applied directly to an application.

Additionally, the type of battery to be measured causes a number of problems when trying to determine the SOH of a battery using the above method. Different rechargeable batteries behave in different manners, have different battery chemistries, and are available in different types from different manufacturers. Some common examples of rechargeable batteries include lithium, lithium ion, lithium nickel, nickel metal hydride, nickel cadmium, and lead-acid.

Another approach to determining the SOH of a battery is the full/partial discharge test. In this approach, the battery is either fully or partially discharged by subjecting the battery to a constant load. During the discharge time, the battery voltage is monitored such that the time it takes for the battery to drop to a certain voltage is compared with that of a healthy battery. This comparison allows for the calculation of the SOH of the battery. However, there a number of drawbacks associated with this approach. This method is expensive, time consuming, and requires the battery to be off-line during testing.

Yet another approach to determining the SOH of a battery involves the use of stand-alone battery monitoring systems. During the aging of a battery, these systems measure the value of one or more electrochemical parameter(s) of the battery. The SOH of the battery is then determined based on the way the parameter(s) changes over time. However, because a history of measurements of the parameter(s) must accumulate before the degradation of these parameter(s) can be determined, the stand-alone battery monitoring systems cannot determine the SOH of the battery without first acquiring these measurements over time.

It is desirable to provide a system for measuring the SOH of a battery which ameliorates the disadvantages discussed above. There is a need for determining the absolute minimum capacity required to perform the intended function of the battery after the battery has been charged in various applications, as discussed above, without the need to perform a running computation of the SOH.

SUMMARY

It would be advantageous to provide a method of determining the SOH of a battery without the need for complex mathematical formulas. Specifically, it would be advantageous to provide a simple method that may readily quantify and report the permanent capacity loss for a battery cell, for example, a lithium battery cell, while in-use that is independent of the intended application.

In accordance with one aspect of the invention, a method calculates a state-of-health (SOH) of a chemical battery including individual or parallel-grouped cells. The method includes charging the battery to a maximum charge potential of the battery. After waiting a predetermined period of time following completion of the charging, an open-circuit voltage (OCV) of the battery is determined. Based on the determined OCV of the battery, the SOH of the battery is determined.

In some embodiments, the predetermined period of time is approximately 30 minutes.

In some embodiments, the method includes maintaining the battery at a temperature of at least about 20° C. during the charging and determining steps. In some embodiments, the temperature is maintained at about 25° C.

In some embodiments, the SOH of the battery is determined by using the determined OCV to consult a look-up table.

In some embodiments, the SOH of the battery is determined by calculating a state-of-charge (SOC) of the battery, after the predetermined period of time, using a second-order polynomial equation. One example of such an equation for one particular application is the following formula: $SOC=-0.026 \times OCV^2+1.584 \times OCV-23.102$. The determined SOC represents the SOH of the battery.

In some embodiments, the method includes calculating a battery energy level (BEL) using the following formula: $BEL=SOH \times SOC \times Cell\ Stack\ Voltage \times 111.6$ (kJ).

In some embodiments, the method includes determining a charging time during which the battery is charging, multiplying the charging time by a measured cell current response for a first cell of the battery to complete charge to determine a coulomb count, and adjusting the BEL by adding the coulomb count to a state-of-charge (SOC) calculation during charging of the battery. For one particular application, the SOC calculation can be based on the following formula: $SOC=-0.026 \times OCV^2+1.584 \times OCV-23.102$.

In some embodiments, the method includes incrementally sampling a load current at regular intervals, summing the sampling to provide a used discharge capacity, and adjusting the BEL by subtracting the used discharge capacity from the SOC calculation during discharging of the battery.

In some embodiments, the method includes resetting the BEL calculation following completion of each normally-terminated full charge event.

Another aspect of the invention relates to a chemical battery management system that estimates the state-of-health (SOH) of a battery. A controller of the battery management system is configured to (i) wait a predetermined period of time after the battery has been fully charged, (ii) after the predetermined period of time, determine an open-circuit voltage (OCV) of the battery, and (iii) determine the SOH of the battery from the determined OCV.

In one particular application, the controller is configured to determine the SOH of the battery by calculating the state-of-charge (SOC) of the battery, after the predetermined period of time, using the following formula: $SOC=-0.026 \times OCV^2+1.584 \times OCV-23.102$, wherein the determined SOC represents the SOH of the battery.

In some embodiments, the controller is configured to control a battery temperature control system to maintain the battery at a temperature of least about 20° C. during the charging and determining.

In some embodiments, the controller is configured to calculate a battery energy level (BEL) using the following formula: $BEL=SOH \times SOC \times Cell\ Stack\ Voltage \times 111.6$ (kJ).

In some embodiments, the controller is configured to (v) determine a charging time during which the battery is charging; (vi) multiply the charging time by a measured cell current response for a first cell of the battery to complete charge to determine a coulomb count; and (vii) adjust the BEL by adding the coulomb count to a state-of-charge (SOC) calculation during charging of the battery.

In some embodiments, the controller is configured to (viii) reset the BEL calculation following completion of each normally-terminated full charge event.

In some embodiments, the controller is configured to (v) incrementally sample a load current at regular intervals; (vi) sum the sampling to provide a used discharge capacity; and (vii) adjust the BEL by subtracting the used discharge capacity from the SOC calculation during discharging of the battery.

In some embodiments, the controller is configured to (viii) reset the BEL calculation following completion of each normally-terminated full charge event.

Another aspect of the invention relates to a method of calculating a state-of-health (SOH) of a chemical battery that includes monitoring and storing a charge time of the battery in a memory. The charge time is a time required for the battery to become fully charged from a predetermined depth-of-discharge using a fixed power input. The method further includes scaling the stored charge time to form a SOH indication. The charge time decreases over a life of the battery.

BRIEF DESCRIPTION OF THE DRAWINGS

Various exemplary embodiments of battery SOH determination methods and systems to which aspects of the invention are applied will be described in detail with reference to the following drawings in which:

FIG. 8 is a graph of an exemplary embodiment of the invention illustrating the charge/discharge cycle changes after 3,000 accumulated cycle counts.

DETAILED DESCRIPTION OF EMBODIMENTS

Exemplary embodiments of methods and systems for determining the SOH of a battery to which aspects of the invention are applied are described below with reference to the figures in the context of batteries, and in particular lithium batteries, in applications such as medical devices, military weapons, or aircraft emergency power applications. However, the invention is applicable to any battery or application in which the SOH of a battery would require/necessitate/benefit from measurement.

The following definitions describe terms presented throughout the body of this application. A returnable (usable) capacity is the discharge capacity stored in a cell following a normally-terminated full charge event. A non-returnable capacity (permanent capacity loss) is a capacity loss of a cell due to aging mechanisms, or stress-life, imposed on the cell. The non-returnable capacity is typically defined as the difference between the beginning-of-life (BOL) (or nameplate) capacity and the actual cell capacity at any time during the usable life of the cell (assuming that the charge sequence and limits are identical to those used to measure the BOL capacity). Stress-life is the normal degradation of a cell's usable capacity through the demonstrated increase in its terminal impedance resulting from cycling (number of usage cycles and their respective depth-of-discharge (DOD) for each), high temperature exposure and duration, and (normal) calendar-life losses occurring within the cell. A state-of-charge (SOC) is an expression used to quantify (in %) the usability of the cell in terms of its relative charge level. A state-of-health (SOH) is the ratio of returnable/(returnable+non-returnable) capacities (in %). The SOH represents the maximum capacity that a battery cell can provide. A depth-of-discharge (DOD) is an indication of the relative capacity during discharge (in %) compared to the initial BOL (or nameplate) capacity for the cell. The DOD is the inverse of the SOC, i.e., 1−DOD=SOC (in %). A battery energy level (BEL) represents the effective energy level of the battery (in kJ, for example). The BEL is the present usability of the battery assembly to support intended functionality in the present (or pending) discharge cycle.

Figure 6:
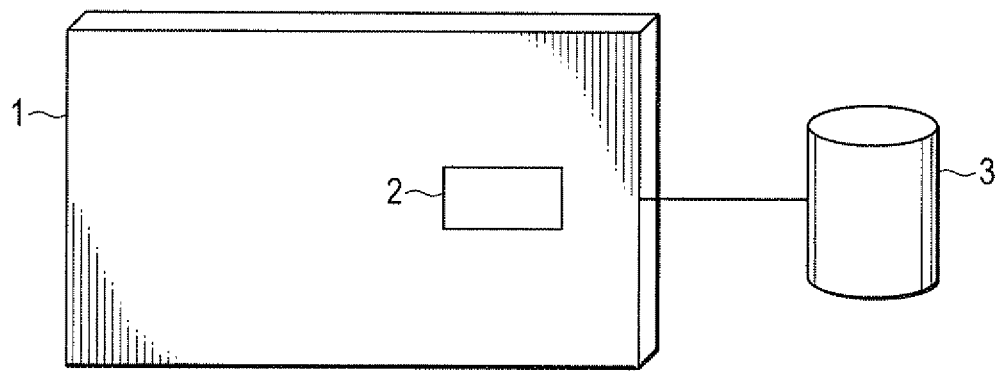
FIG. 6 is perspective view of a battery management system.

Referring to FIG. 6, a battery 3, such as a lithium battery, includes cell(s) (either individual or parallel-grouped cells) that serve as the power source and a Battery Management System (BMS) 1, which incorporates such things as cell monitoring, protections, and charge functions for the cells. In particular, the BMS includes a microcontroller 2 and application-specific software that makes the necessary measurements for SOC, SOH, and the like. The controller 2 is able to monitor and record cell and battery parameters (i.e., voltages, currents, temperatures, times, etc.) as deemed necessary to sufficiently characterize the cells while in use.

Figure 1:
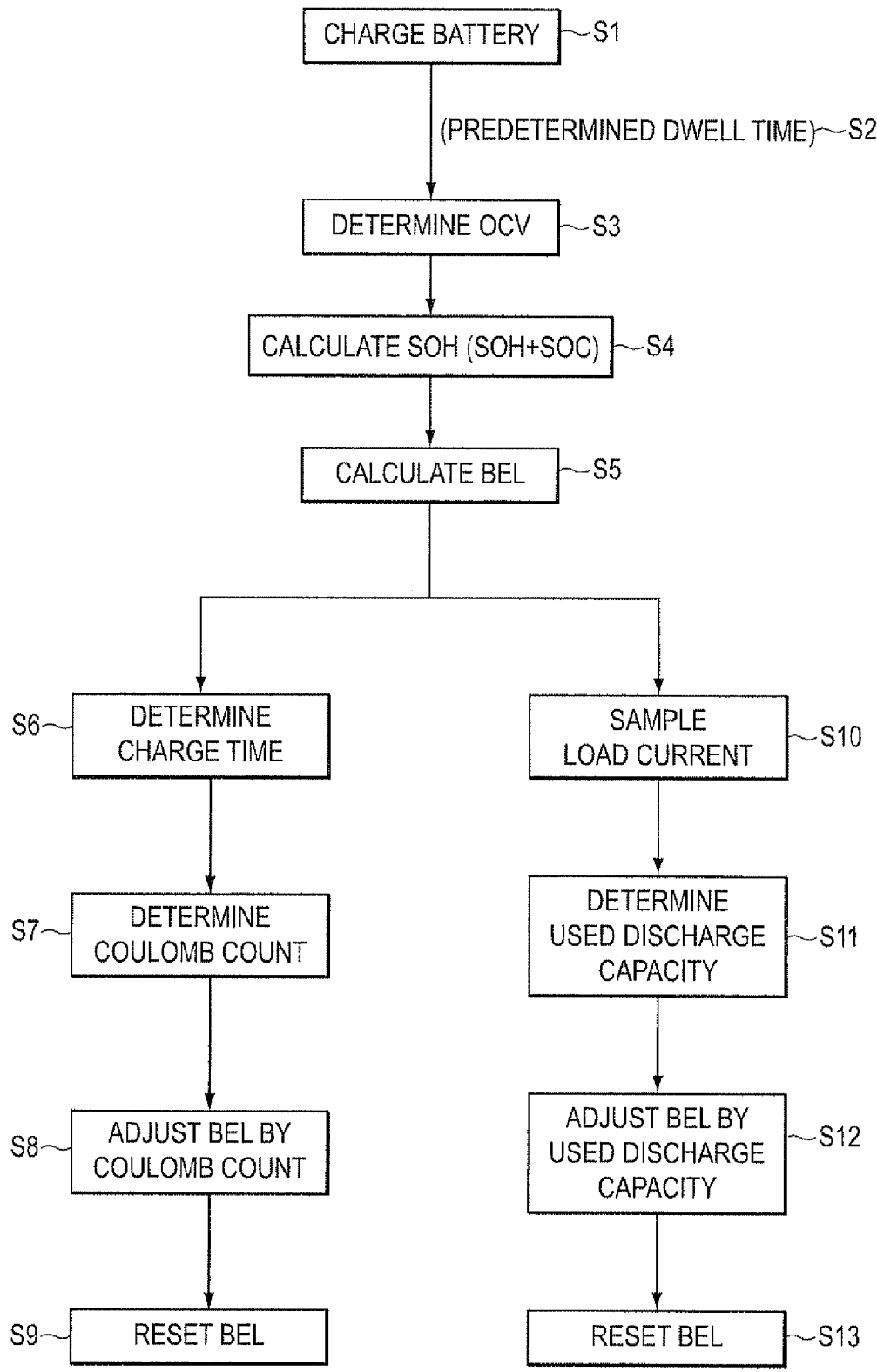
FIG. 1 is a flowchart of an exemplary embodiment of the invention illustrating a state-of-health determination method.

FIG. 1 is a flowchart of an exemplary embodiment illustrating a state-of-health (SOH) determination method that is performed by the controller 2 of the BMS 1. This embodiment is referred to as the open-circuit voltage (OCV) following charge method (i.e., the OCV method). Using the OCV method, the SOC of the battery and subsequently the SOH of the battery can be determined. Based on the following, the BMS software can provide status reports as to the SOC, SOH, and BEL of the battery.

In the OCV method, the BMS first computes the SOC of the battery after the battery has been fully charged. The SOC provides an indication of the level of charge for the battery and thus, functions much like a fuel gauge. The SOC can be computed based on the following three scenarios. The SOC1 (SOC scenario 1) is computed by charging the battery cells so as to reach the target end-of-charge voltage (EOCV) following completion of a normally-terminated full charge event (i.e., the SOC is reported as 100%). At any other time, other than immediately following completion of a charge event, however, the cells will demonstrate a reduced OCV based upon their internal impedance, which is a function of operating temperature and accumulated stress-life exposure. Aged cells will thus typically have an OCV that is less than their EOCV if, after fully-charging the battery, the battery is kept idle and not connected to a load (i.e., while the battery remains in (on) the application through the use of either solid-state or mechanical contactors contained within the battery assembly to either connect or isolate the cell stack from the battery's output terminals) for at least a predetermined period after completion of the charge cycle. A more accurate SOC computation is obtained when the cell stack is maintained at or near a constant temperature. Any stress-life impact will be reflected in the SOH computation, as discussed below.

The SOC2 (SOC scenario 2) is computed when the battery is inactive and not connected to a load (for example, when installed onto a vehicle such as an aircraft which is idle or parked). The SOC2 is thus the nominal response from the battery's OCV in terms of % based on the following formula:

$$SOC = A \times OCV^2 + B \times OCV - C.$$

The A and B represent the slope (or characteristic inflection) of the response, and C represents the OCV expected at 0% SOC (or the x-axis intercept). The response is typically generated from a discharge response following a full charge where the capacity (Amp-hour) is subsequently removed in 10% increments relative to the battery (cell) nameplate capacity to generate the response characteristic. A second-order polynomial curve fit is then applied to the generated SOC vs. OCV response. The second-order polynomial curve fit is then adjusted to minimize the error at the lower SOC levels (in consideration of emergency power, or reserve energy calculations) and conservatively report (i.e., under-estimate) the higher SOC values, which are reset when fully charged as per SOC1 (above).

Figure 2:
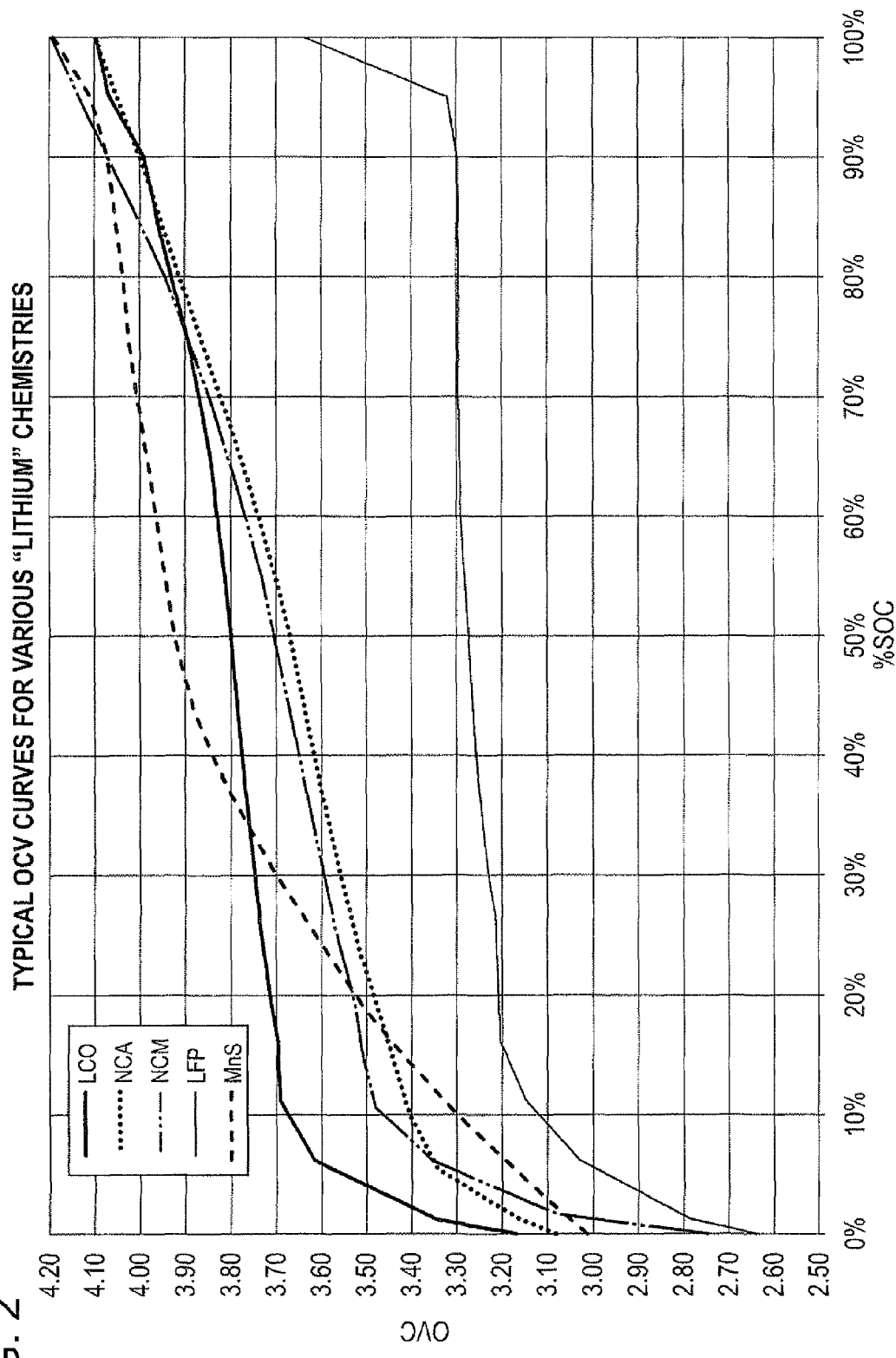
FIG. 2 is a graph of an exemplary embodiment of the invention illustrating a typical OCV Curve for various lithium chemistries.

The above formula is applicable to lithium and other chemistries that do not have a flat discharge (or OCV vs. SOC) response characteristic. FIG. 2 illustrates examples of OCV curves for various "lithium" chemistries. For example, for a 7S1P (7 series, 1 parallel) battery array of an NCM (nickel, cobalt, manganese lithium-ion) chemistry, the SOC2 is the nominal response from the battery's OCV in terms of % based on the following formula:

$$SOC = -0.026 \times OCV^2 + 1.584 \times OCV - 23.102, \text{ where } 0.0 \le SOC \le 1.0.$$

Additionally, for example, when the SOC is 0% (i.e., 0.0), the cell stack is ≤24.15V. When the SOC is 100% (i.e., 1.0), the cell stack is 29.40V.

The SOC3 (SOC scenario 3) is computed when the battery is connected to a load (for example, a vehicle bus), or when actively charging/discharging. The BMS will then determine a "coulomb count" to capture the amp-hours (seconds) to be either subtracted during discharge, or added while in charge to the baseline SOC measurement obtained from either the EOCV (SOC1) or the OCV (SOC2), as applicable, to report the active SOC changes during normal battery operation.

Based on at least some of the above SOC computations, the BMS controller can then determine the SOH of the battery. As discussed previously, the SOH indicates the returnable capacity of the battery once fully charged. The SOH provides an indication of the permanent capacity loss of the cells due to cycle count and their DOD, temperature exposure, and calendar-life stresses. The SOH degrades from 100% at BOL but does not do so rapidly unless the battery is stressed beyond its specified operating conditions for an extended duration. The OCV can provide a measure of the permanent capacity loss by the reduction in the terminal voltage after completion of a normally-terminated full charge event such that the OCV will decay, or decrease from its EOCV, after an extended predetermined period of time (i.e., "dwell time" or "decay time"). Thus, the SOC computation following a predetermined period of time provides the battery's SOH response.

Figure 3:
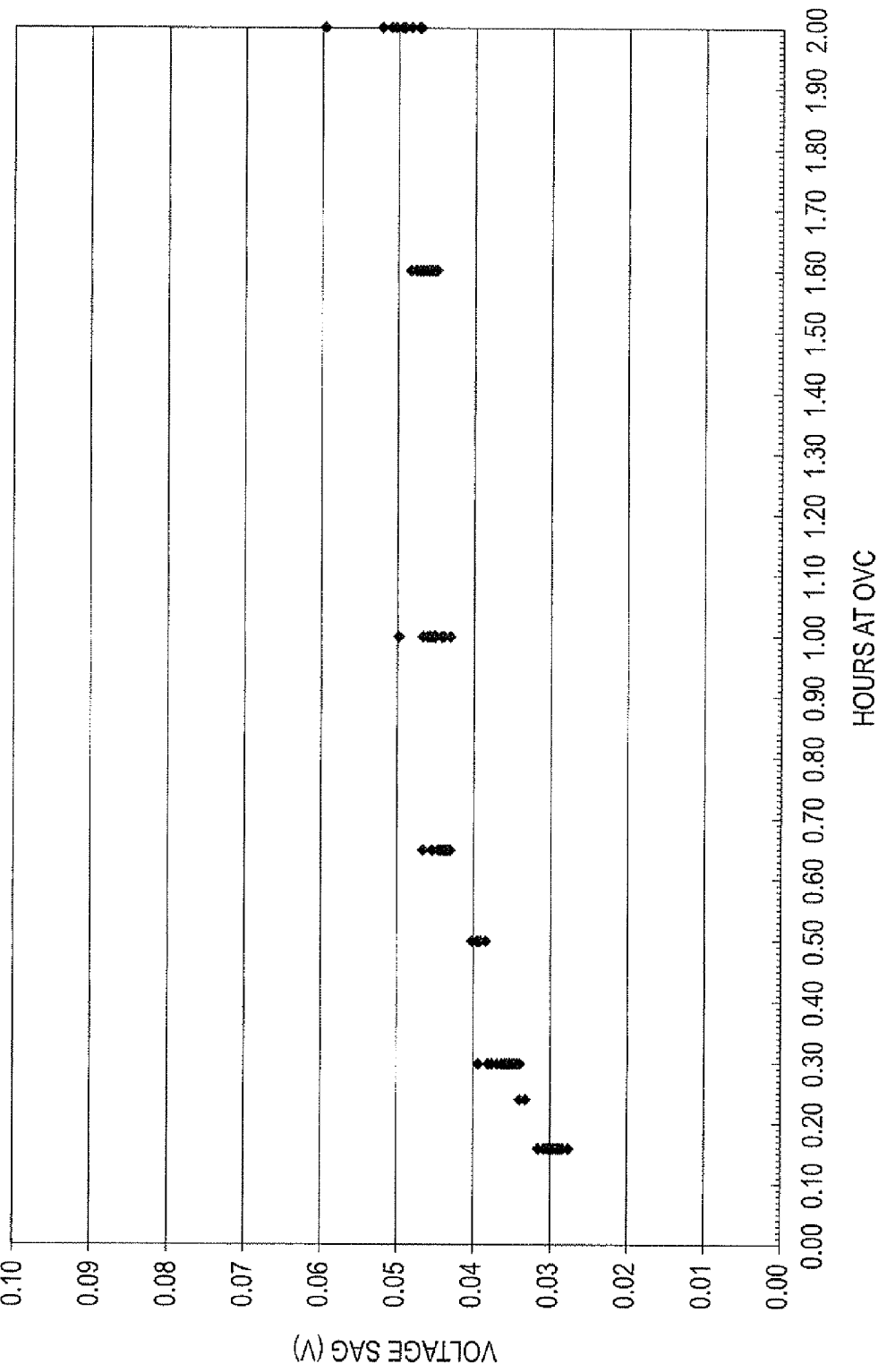
FIG. 3 is a graph of an exemplary embodiment of the invention illustrating an OCV Sag vs. Dwell Time.

Accordingly, when the battery is not connected to a load following completion of a normally terminated full charge event and after a subsequent dwell period such as when the application completes its operational cycle, the SOH is equivalent to the idle-state SOC2 (discussed above). As discussed above, this condition is facilitated by "switches" that are either electrical or mechanical-based and contained within the battery assembly. The battery remains within the application but is effectively "off-line" when the application is dormant (i.e., not in use). The dwell time following the normally-terminated full charge event can be, for example, a 30 minute open-circuit dwell period. However, the dwell time is not limited to this period of time. Instead, based on the specific battery and battery chemistry being subjected to the above calculations, the BMS will use an appropriate dwell time prior to the SOC computation, based on stored data relating to that particular battery type and chemistry. Specifically, the appropriate dwell time is a variable defined within the BMS software, which is dependent on the cell chemistry and/or the specific cell application, and is determined by experiment in advance. The dwell time can be any duration. Specifically, the longer the dwell time, the more time the OCV response has to stabilize; however, should the application require a shorter dwell time (i.e., less than 30 minutes), a correlation and corresponding "correction" factor should be established. For example, FIG. 3 illustrates the characteristic response for the example battery, discussed above, for the OCV following various dwell (idle) periods. First, the time required to achieve a stable OCV response for the intended cell/battery must be found. Then, the necessary dwell time is selected dependent upon the limitations and requirements of the specific application from this characteristic. The difference between the OCV response at the selected dwell time vs. that at the "stable" time is the correlation factor that can be applied to achieve the required OCV to thus compute the actual SOC.

The captured OCV is used to calculate SOC2, as described above, which represents the permanent loss of cell capacity and is reported as the battery's SOH figure, following normal full charge. For example, if SOC2 is determined to be 0.9, then the SOH is 90% of the original capacity.

Alternatively, the captured OCV can be sealed to represent the permanent loss of cell capacity, with the scaled result being reported as the SOH. To establish the scaling factor, separate laboratory characterization tests are performed in advance for the specific cell design at issues. The tests capture the decrease in OCV as a function of applied stresses. During lab testing, periodic discharge capacity tests are conducted to establish the correlation (sealing) between the OCV and returnable capacity of a particular battery (e.g., a lithium battery).

Figure 4:
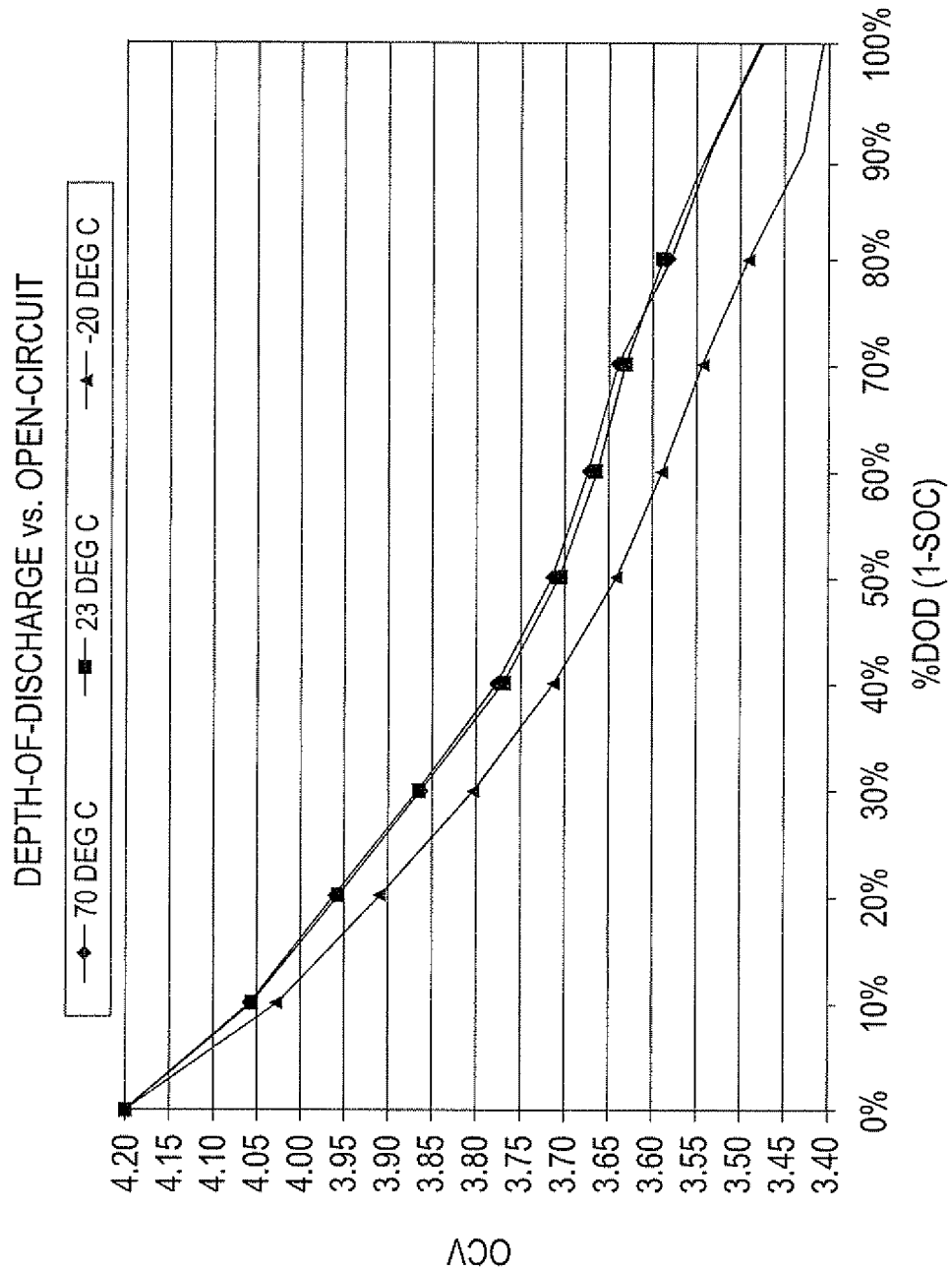
FIG. 4 is a graph of an exemplary embodiment of the invention illustrating a depth-of-discharge vs. open-circuit voltage.

FIG. 4 illustrates a characterization of a lithium battery cell as a function of the operating temperature to convey the battery's OCV versus its incremental capacity (or SOC, when new). The battery cell will continue to follow this SOC/DOD response throughout its life regardless of the imposed stress-life degradation, but will regress from about the 100% mark following the completion of a normally-terminated full charge event.

The data provided from FIG. 4 illustrates that the most consistent cell response is at temperatures at and above about 20° C. Thus, the BMS includes a battery temperature control system that operates cell heaters or cell coolers to maintain the battery at a nominal 25° C. temperature during charging of the battery and the determination of the SOH. The sustained temperature ensures a more consistent behavior through the battery's life cycle across varied ambient conditions. For example, for aircraft use, only cell heaters are required since environment at the altitude will provide sufficient cooling "load" for the battery. Additionally, for example, in outer space applications, external environmental controls and cell heating is utilized; whereas, in certain defense applications, only cell cooling is utilized.

Figure 5:
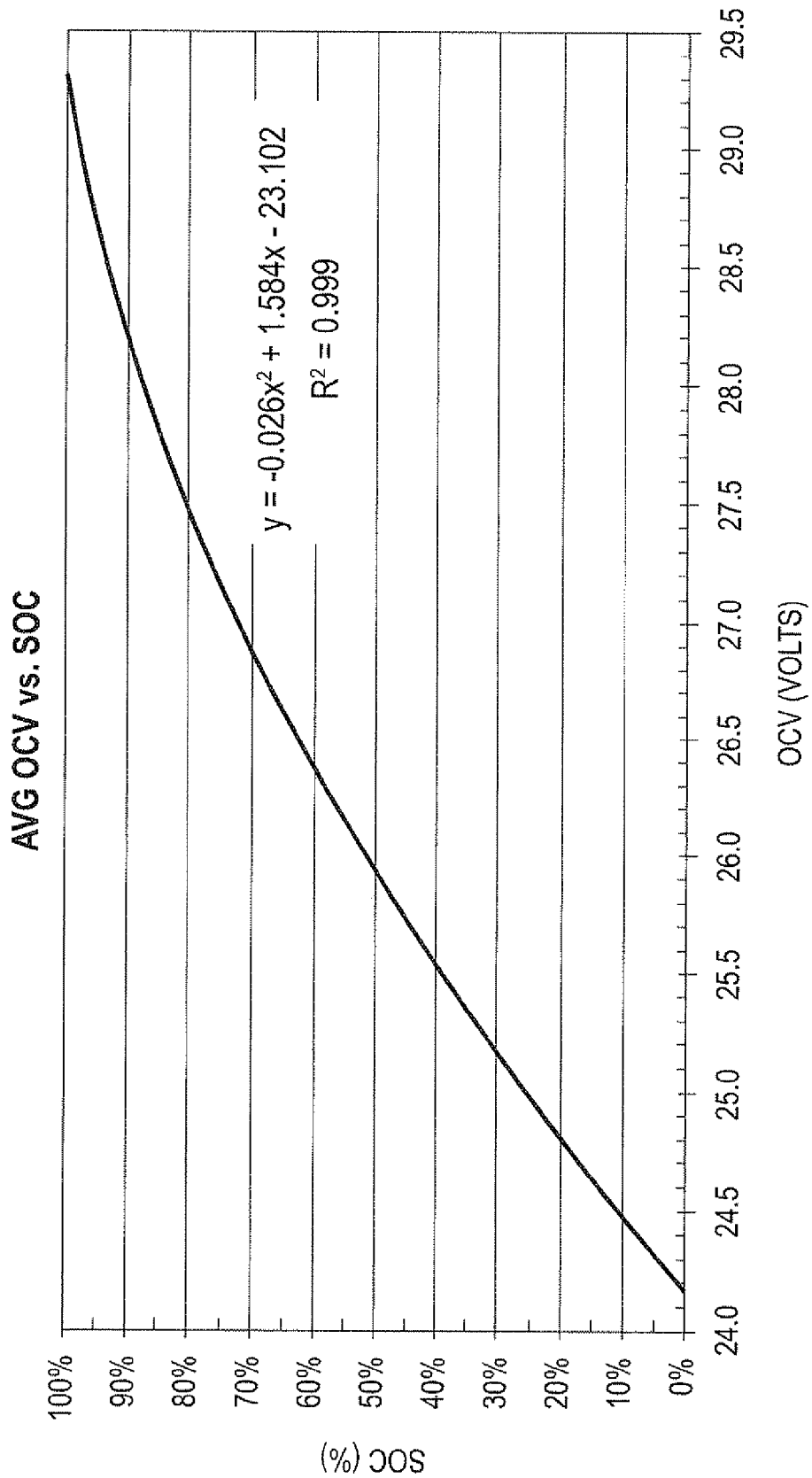
FIG. 5 is a graph of an exemplary embodiment of the invention illustrating an average open-circuit voltage vs. state-of-charge.

Additionally, because the battery is composed of a cell stack (i.e., a series of cells arranged by individual or parallel-grouped cells) and the battery's output is the sum of the cell series "strings," the data obtained from FIG. 4 is used to address the battery's operational behavior. In particular, FIG. 5 illustrates the average OCV v. SOC (i.e., a general SOC v. OCV response) obtained by averaging and converting (inverting) the data of FIG. 4. From this response, the polynomial characterization of the battery's OCV as a function of its SOC can be represented in the BMS software. One example of the polynomial characteristic is provided above with respect to the calculation of SOC2.

Following termination of a discharge/charge event, the battery's OCV will require a predetermined period of time in order to stabilize and recover to a level above (for a discharge event) or below (for a charge event) the working terminal voltage of the battery, as reported by the BMS during the event. A characterization, as discussed above, is required for different battery cells in order to determine the appropriate predetermined period of time (i.e., "dwell time," "decay time," or "wait time") before a usable OCV is obtained. Thus, correlations are established that provide an "offset" adjustment to the SOC from an early OCV reading to address accuracy concerns with the SOH computation. These correlations are stored in the BMS software as a look-up table of information allowing the determined OCV to be used to determine the SOH.

Once the SOH computation has been completed, the BMS will store the results of the SOC and SOH calculations in a non-volatile memory (e.g., EEPROM) so that a user may access the information when desired at a later time. Specifically, the BMS includes a SOH request mechanism, for example, a button, that the user presses to cause the BMS controller to provide a push-to-test (PTT) status report including the SOC and SOH calculations previously stored in memory. The PTT status report could be printed on a sheet by a printer of the BMS or displayed on a display of the BMS. This feature allows a user to access the report at regular intervals until such time as the calculations can be updated to include new computations following a normally-terminated full charge event. Alternatively, the PPT status report uses a serial-data interface to transmit various battery and cell operating parameters, including the SOC, SOH, and BEL, via RS232, RS485, ARINC 429, CAN or other communication protocols.

Although the stress-life of the battery is cumulative, the effect on the battery's returnable capacity is not expected to be significant from event to event or even over a reasonable period of inactivity for most commercially applied lithium chemistries. Thus, a running computation of the SOH is not required. A periodic update of the SOH following a set predetermined period of time after a normally-terminated full charge event is sufficient.

FIG. 1 illustrates the step-by-step process for determining the above computations. The method of calculating the SOH of the battery using the OCV method starts by first charging the battery to a maximum charge potential of the battery S1. After waiting a predetermined period of time S2 (i.e., "dwell time" or "decay time"), the BMS controller determines the OCV of the battery S3. Using the OCV determined in S3, the BMS controller calculates the SOC of the battery S4 by consulting a look-up table or based on an appropriate polynomial formula such as, for example, the following formula:

$$SOC = -0.02 \times OCV^2 + 1.584 \times OCV - 23.102, \text{ where } 0.0 \leq SOC \leq 1.0.$$

For example, when the SOC is 0% (i.e., 0.0), the cell stack is ≤24.15V. When the SOC is 100% (i.e., 1.0), the cell stack is 29.40V. The SOH is then determined by the BMS controller to be the SOC calculated in S4.

Given the SOH, the BMS controller can also calculate the battery energy level (BEL) S5 of the battery based on the following formula:

$$BEL = [SOH(\%) \times SOC \times \text{Nameplate Capacity}] \times \text{Working Battery Voltage} \times (3600/1000)$$

OR $$BEL = SOH \times SOC \times \text{Cell Stack Voltage} \times 111.6.$$

The nameplate capacity is the stated value of the battery at a temperature of, for example, 25° C. (i.e., 31 Ah), while the "3600/1000" factor converts hours to seconds, and Joules to kilo-Joules.

When the battery is active (i.e., in use during charging or discharging), the BEL can be adjusted via coulomb counting. Coulomb counting captures the current level experienced during charging or discharging over the accumulated event time (i.e., time it takes to charge or discharge). In order to adjust the BEL during a charge event, the BMS controller first determines a charge time S6 such that the charge time is the length of time required to completely charge the battery. In order to determine the coulomb count S7, the BMS controller then multiplies the charge time by a measured cell current response for a first cell of the battery to complete a full charge. The BEL is then adjusted by the coulomb count to estimate the adjusted BEL during charge S8. On the other hand, in applications where the charge current is adjusted during the charge event due to thermal management considerations (i.e., the charge profile is not consistent through the duration of the event), an "incremental" charge current vs. time approach (such as for the discharge coulomb count) may be utilized. Using this approach, the charge current level is reduced as a function of battery temperature to either (1) thermally protect the electronics within the battery or (2) as a means to reduce stress on the lithium cells when they are at an elevated ambient temperature. This method "accumulates" the amperage over smaller intervals of time to accommodate any charge level changes instituted during the charge event. The time-based resolution (i.e., minutes, seconds, fractional seconds) for the coulomb counting of this method depends upon the specific needs of the application and the need for charge current control. This method is similar to coulomb counting during discharge, as discussed below, except it is applied to the charge event.

Alternatively, in order to adjust the BEL during a discharge event, the BMS controller incrementally samples a load current at regular intervals S10. A used discharge capacity is calculated by summing the sampling S11. The BEL is then adjusted by subtracting the used discharge capacity from the SOC calculation determined during discharge of the battery S12. Finally, after a normally-terminated full charge event, the BEL calculation is reset since such a calculation is based on the SOH determination S9 and S13.

Figure 7:
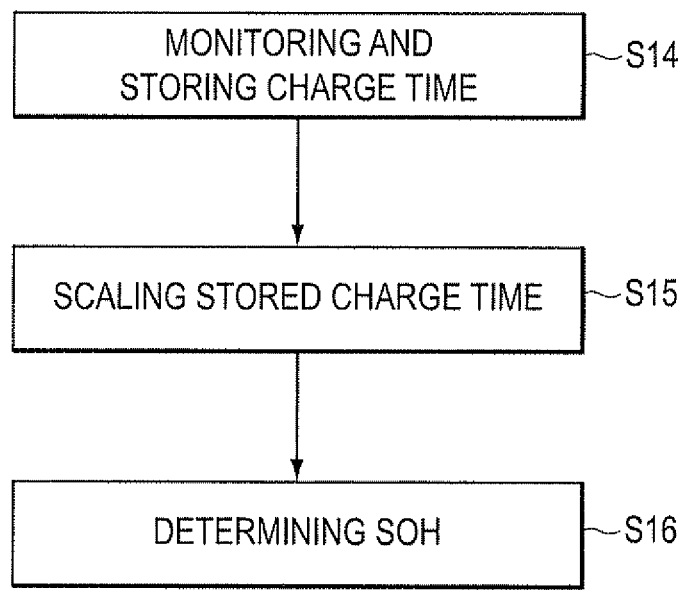
FIG. 7 is a flowchart of another exemplary embodiment of the invention illustrating a state-of-health determination method.

FIG. 7 is a flowchart of an exemplary embodiment illustrating another embodiment of a state-of-health determination method. This embodiment is referred to as the time to fully charge method (i.e., the TTC method). As the cell ages or is utilized, the time it takes to fully charge the cell from a specified DOD with a fixed power input will continue to decrease. Thus, for applications that typically experience consistent discharge and charge cycles, the resultant time to charge directly correlates to the cell's permanent capacity loss. This method is optimal, for example, in outer space applications that have a consistent charge/discharge profile, e.g. a LEO, GEO, or related orbit.

Thus, as illustrated in FIG. 7, the TTC method includes monitoring and storing a charge time of the battery in a non-volatile memory (e.g., EEPROM) by the BMS S14. The charge time is the time required for the battery to become fully charged from a predetermined DOD using a fixed power input. The stored charge time is then scaled S15 to form an SOH indication S16. Scaling is determined on a case-by-case basis. That is, a life-cycle test with intended usage profile is exercised in order to capture the change in charge or discharge time related to a proximal capacity cycle for a given application. The charge time will decrease over the life of the battery.

As illustrated in FIG. 8, the charge voltage response more rapidly ascends toward the charge potential as a function of increased cycle count. The charge time is thus monitored and stored in a non-volatile memory by the BMS. The captured charge time is then scaled to form a SOH indication. As discussed above with respect to the OCV method, an independent laboratory test regime for the intended cell design is performed to define the correlation (scaling) between the charge response time and the cell's capacity loss as determined from periodic capacity tests.

The illustrated exemplary embodiments of the state-of-health determination method and system as set forth above are intended to be illustrative and not limiting. Various changes may be made without departing from the spirit and scope of the invention.

What is claimed is:

1. A method of calculating a state-of-health (SOH) of a chemical battery including individual or parallel-grouped cells, the method comprising:
   charging the battery to a maximum charge potential of the battery;
   after waiting a predetermined period of time after completion of the charging, determining an open-circuit voltage (OCV) of the battery; and
   based on the determined OCV of the battery, determining the SOH of the battery, wherein the SOH of the battery is determined by calculating a state-of-charge (SOC) of the battery, after the predetermined period of time, using the following formula:
   $SOC = A \times OCV^2 + B \times OCV - C$, wherein the SOC represents the SOH of the battery, A and B represent the slope of the response, and C represents the OCV expected at 0% SOC.

2. The method according to claim 1, wherein the predetermined period of time is approximately 30 minutes.

3. The method according to claim 1, further comprising:
   maintaining the battery at a temperature of at least about 20° C. during the charging and determining steps.

4. The method according to claim 3, wherein the temperature is maintained at about 25° C.

5. The method according to claim 1, further comprising:
   calculating a battery energy level (BEL) using the following formula:

$BEL = SOH \times SOC \times Cell\ Stack\ Voltage \times 111.6\ (kJ)$.

6. The method according to claim 5, further comprising:
   determining a charging time during which the battery is charging;
   multiplying the charging time by a measured cell current response for a first cell of the battery to complete charge to determine a coulomb count; and
   adjusting the BEL by adding the coulomb count to a state-of-charge (SOC) calculation during charging of the battery, wherein
   the SOC calculation is based on the following formula:
   $SOC = -0.026 \times OCV^2 + 1.584 \times OCV - 23.102$.

7. The method according to claim 5, further comprising:
   incrementally sampling a load current at regular intervals;
   summing the sampling to provide a used discharge capacity; and
   adjusting the BEL by subtracting the used discharge capacity from the SOC calculation during discharging of the battery.

8. The method according to claim 6, further comprising:
   resetting the BEL calculation following completion of each normally-terminated full charge event.

9. The method according to claim 7, further comprising: resetting the BEL calculation following completion of each normally-terminated full charge event.

10. The method according to claim 1, wherein the SOH of the battery is determined by using the determined OCV to consult a look-up table.

11. A chemical battery management system comprising:
a battery and a controller configured to charge the battery, that estimates a state-of-health (SOH) of the battery, wherein the controller is configured to (i) wait a predetermined period of time after the battery has been fully charged, (ii) after the predetermined period of time, determine an open-circuit voltage (OCV) of the battery, and (iii) determine the SOH of the battery from the determined OCV, wherein the controller is configured to determine the SOH of the battery by calculating the state-of-charge (SOC) of the battery, after the predetermined period of time, using the following formula:
$SOC = A \times OCV2 + B \times OCV - C$, wherein the SOC represents the SOH of the battery, A and B represents the slope of the response, and C represents the OCV expected at 0% SOC.

12. The chemical battery management system according to claim 11, wherein the predetermined period of time is approximately 30 minutes.

13. The chemical battery management system according to claim 11, wherein the controller is configured to control a battery temperature control system to maintain the battery at a temperature of least about 20° C. during the charging and determining.

14. The chemical battery management system according to claim 13, wherein the temperature is maintained at about 25° C.

15. The chemical battery management system according to claim 11, wherein the controller is configured to calculate a battery energy level (BEL) using the following formula:
$$BEL = SOH \times SOC \times \text{Cell Stack Voltage} \times 111.6 \text{ (kJ)}.$$

16. The chemical battery management system according to claim 15, wherein the controller is configured to (v) determine a charging time during which the battery is charging; (vi) multiply the charging time by a measured cell current response for a first cell of the battery to complete charge to determine a coulomb count; and (vii) adjust the BEL by adding the coulomb count to a state-of-charge (SOC) calculation during charging of the battery.

17. The chemical battery management system according to claim 16, wherein the controller is configured to (viii) reset the BEL calculation following completion of each normally-terminated full charge event.

18. The chemical battery management system according to claim 15, wherein the controller is configured to (v) incrementally sample a load current at regular intervals; (vi) sum the sampling to provide a used discharge capacity; and (vii) adjust the BEL by subtracting the used discharge capacity from the SOC calculation during discharging of the battery.

19. The chemical battery management system according to claim 18, wherein the controller is configured to (viii) reset the BEL calculation following completion of each normally-terminated full charge event.

* * * * *